United States Patent
Fiorenza et al.

(10) Patent No.: US 11,538,709 B2
(45) Date of Patent: Dec. 27, 2022

(54) METHOD OF TRANSFER PRINTING

(71) Applicant: Analog Devices International Unlimited Company, Limerick (IE)

(72) Inventors: James G. Fiorenza, Carlisle, MA (US); Susan L. Feindt, Andover, MA (US); Michael D. Delaus, Andover, MA (US); Matthew Duffy, Wilmington, MA (US); Ryan Iutzi, Somerville, MA (US); Kenneth Flanders, Reading, MA (US); Rama Krishna Kotlanka, Belmont, MA (US)

(73) Assignee: Analog Devices International Unlimited Company, Limerick (IE)

( * ) Notice: Subject to any disclaimer, the term of this patent is extended or adjusted under 35 U.S.C. 154(b) by 77 days.

(21) Appl. No.: 16/486,695

(22) PCT Filed: Feb. 17, 2018

(86) PCT No.: PCT/IB2018/000203
§ 371 (c)(1),
(2) Date: Aug. 16, 2019

(87) PCT Pub. No.: WO2018/150262
PCT Pub. Date: Aug. 23, 2018

(65) Prior Publication Data
US 2021/0134641 A1    May 6, 2021

Related U.S. Application Data

(60) Provisional application No. 62/460,326, filed on Feb. 17, 2017.

(51) Int. Cl.
*H01L 23/00* (2006.01)
*H01L 23/482* (2006.01)
(Continued)

(52) U.S. Cl.
CPC ...... *H01L 21/6835* (2013.01); *H01L 25/0753* (2013.01); *H01L 33/0095* (2013.01);
(Continued)

(58) Field of Classification Search
CPC . H01L 21/6835; H01L 22/32; H01L 22/0095; H01L 22/62; H01L 2221/68354;
(Continued)

(56) References Cited

U.S. PATENT DOCUMENTS

2008/0108171 A1* 5/2008 Rogers ............... H01L 21/6835
438/73
2010/0317132 A1* 12/2010 Rogers ................... H01L 24/83
438/27
(Continued)

FOREIGN PATENT DOCUMENTS

WO    WO-2018150262 A1    8/2018

OTHER PUBLICATIONS

"International Application Serial No. PCT/IB2018/000203, International Search Report dated May 30, 2018", 5 pgs.
(Continued)

*Primary Examiner* — Caridad Everhart
(74) *Attorney, Agent, or Firm* — Schwegman Lundberg & Woessner, P.A.

(57) ABSTRACT

A transfer printing method is described that can be used for a wide variety of materials, such as to allow for circuits formed of different materials to be integrated together on a single integrated circuit. A tether (18) is formed on dice regions (16) of a first wafer (30), followed by attachment of a second wafer (32) to the tethers. The dice regions (16) are processed so as to be separated, followed by transfer printing of the dice regions to a third wafer (34).

23 Claims, 7 Drawing Sheets

(51) Int. Cl.
*H01L 21/683* (2006.01)
*H01L 25/075* (2006.01)
*H01L 33/00* (2010.01)
*H01L 33/32* (2010.01)
*H01L 33/62* (2010.01)
*B41F 16/00* (2006.01)

(52) U.S. Cl.
CPC .............. *H01L 33/32* (2013.01); *H01L 33/62* (2013.01); *B41F 16/00* (2013.01); *H01L 2221/68354* (2013.01); *H01L 2221/68368* (2013.01); *H01L 2933/0066* (2013.01)

(58) Field of Classification Search
CPC ... H01L 2221/68368; H01L 2221/6854; H01L 2221/68358; H01L 25/0753; H01L 25/0655; H01L 2221/68318; H01L 23/562; B41F 16/00
See application file for complete search history.

(56) References Cited

U.S. PATENT DOCUMENTS

| | | | | |
|---|---|---|---|---|
| 2012/0126229 | A1* | 5/2012 | Bower | H01L 24/83 257/48 |
| 2012/0314388 | A1* | 12/2012 | Bower | H01L 24/83 361/760 |
| 2015/0207012 | A1* | 7/2015 | Rogers | H01L 31/1892 136/255 |
| 2015/0372187 | A1 | 12/2015 | Bower et al. | |
| 2015/0380904 | A1* | 12/2015 | Nagatomo | G01B 9/02091 356/479 |
| 2016/0086855 | A1* | 3/2016 | Bower | H01L 24/83 257/798 |
| 2017/0331248 | A1* | 11/2017 | Lambert | G02B 6/12004 |
| 2019/0221552 | A1* | 7/2019 | Bower | H01L 25/167 |
| 2019/0326149 | A1* | 10/2019 | Bower | B65G 47/91 |

OTHER PUBLICATIONS

"International Application Serial No. PCT/IB2018/000203, Written Opinion dated May 30, 2018", 8 pgs.

Gomez, David, et al., "Scalability and Yield in Elastomer Stamp Micro-Transfer-Printing", 2017 IEEE 67th Electronic Components and Technology Conference, (2017), 1779-1785.

"Taiwanese Application Serial No. 107105581, Office Action dated Nov. 20, 2018", W/ English Translation, 6 pgs.

* cited by examiner

METHOD OF TRANSFER PRINTING

CLAIM OF PRIORITY

This is a U.S. National Stage Patent Application which claims priority to Application Serial Number PCT/IB2018/000203, filed Feb. 17, 2018, and published on Aug. 23, 2018 as WO 2018/150262 A1, which claims the benefit of priority of U.S. Provisional Patent Application Ser. No. 62/460,326, filed Feb. 17, 2017, which are hereby incorporated by reference herein in their entirety.

FIELD OF THE DISCLOSURE

The disclosure generally relates to fabricating integrated circuits and, more particularly to transfer printing integrated circuits.

BACKGROUND

Multiple independently formed integrated circuit dice often are mechanically and electrically coupled to form a combination electronic product. To that end, some processes separately fabricate two or more integrated circuit dice, and then combine those integrated circuit dice using conventional processes, such as micro-transfer printing processes. During the micro-transfer printing process, an integrated circuit die typically is removed from a first wafer and positioned in close proximity to a second integrated circuit die. At some point thereafter, the process electrically connects the two integrated circuit dice to produce the combination electronic product.

SUMMARY OF THE DISCLOSURE

In certain micro-transfer printing methods, one or more adjacent chiplets, which can also be referred to as dice, can be formed on a silicon wafer with an oxide layer between the one or more chiplets and the silicon wafer. The oxide layer can be etched, such as to remove the oxide layer below the one or more adjacent chiplets. The etching process can be tuned such that a thin layer of silicon can remain between the one or more adjacent chiplets and the silicon wafer and can hold the chiplets in place. One or more parameters of the etching process (e.g., concentration of etchant, etch time, temperature, pressure, etc.) can be determined by experimentation and can be different for each set of materials. The etching process may not work for material combinations not having a sacrificial etch layer, such as the silicon dioxide sacrificial etch layer in silicon when hydrofluoric acid can be used as an etchant. An elastomeric element can then be used to pick up an individual one of the one or more chiplets. The thin layer of silicon connecting the individual one of the one or more chiplets to the other adjacent chiplets can break upon the chiplet being picked up by the elastomeric element. The broken thin layer of silicon can remain on the silicon wafer with the remaining chiplets.

The inventors have recognized that the micro-transfer printing method described above with respect to silicon may not be suitable for processes involving gallium nitride (GaN) on silicon carbide (SiC) or other compound semiconductor materials because of differences in physical and chemical properties and also because there may not be an analogous oxide layer in GaN that can be etched away as can be done with the silicon. The inventors have recognized that a transfer printing method can be employed that uses tethers (e.g. polymer tethers) that can be adjusted in size to determine a strength of the tether to provide a transfer printing method that is universal and can be used with any combination of semiconductor materials. Such an approach can be universal because the same tethering process can be used with any device type (e.g., devices composed of different semiconductor materials). For example, GaN devices can be combined with SiC devices or BCDMOS devices. In another example, SiGe devices can be combined with BiCMOS devices where a bipolar process can be separated from the CMOS process. Such an approach can also be parallel at every step and thus can be scalable to large numbers of devices, such as to allow constant improvement over time including reduced chiplet size, and spacing and interconnect parasitics.

In an aspect, the disclosure can feature a method of transfer printing that can accommodate a first semiconductor structure and a second semiconductor structure. The method can include joining a first end of a tether structure to one of a plurality of dice regions on a first wafer. The method can also include attaching a second wafer to a second end of the tether structure. The method can also include processing the first wafer, such as to disconnect the one of the plurality of dice regions on the first wafer from other dice regions on the first wafer. The method can also include separating the one of the plurality of dice regions on the first wafer and the tether structure from the second wafer. The method can also include attaching the separated one of the plurality of dice regions to a third wafer using the second end of the tether structure. The method can also include selecting a cross sectional area of the tether structure in contact with the one of the plurality of dice regions, such as based on a size of the one of the plurality of dice regions. The method can also include selecting a cross sectional area of the tether structure in contact with the one of the plurality of dice regions, such as based on an area of the one of the plurality of dice regions. The method can also include selecting a cross sectional area of the tether structure in contact with the one of the plurality of dice regions, such as based on a volume of the one of the plurality of dice regions. The method can also include using an elastomeric mask to separate the one of the plurality of dice regions on the first wafer and the tether structure from the second wafer. Processing the first wafer to disconnect the one of the plurality of dice regions can include at least one of mechanical grinding, mechanical dicing, or chemical etching. The method can also include joining a first end of a tether structure to one of a plurality of dice regions on a fourth wafer. The method can also include attaching a fifth wafer to a second end of the tether structure. The method can also include processing the fourth wafer to disconnect the one of the plurality of dice regions on the fourth wafer from other dice regions on the fourth wafer. The method can also include separating the one of the plurality of dice regions on the fourth wafer and the tether structure from the fifth wafer. The method can also include attaching the separated one of the plurality of dice regions to the third water using the second end of the tether structure, wherein the one of the plurality of dice regions on the first wafer includes silicon and the one of the plurality of dice regions on the fourth wafer includes gallium nitride. The method can also include patterning an electrical connection onto the third wafer prior to the attachment of the dice region to the third wafer. The method can also include forming solder bumps onto the electrical connections, the solder bumps being configured to accommodate at least one electrical connection to each of the dice regions attached to the third wafer. The method can also include forming vias configured to connect a patterned electrical connection on the third wafer to at least one of the dice regions. The method can also include forming a conductive layer adjacent to the dice regions on a side of the dice regions opposite to the third wafer. The method can also include dicing the third wafer and surrounding the dice regions on the third wafer with a packaging material, wherein at least one electrical connection connects the dice regions on the third wafer to an exterior of the packaging material.

In an aspect, the disclosure can feature a method of parallel transfer printing that can accommodate a first semiconductor structure and a second semiconductor structure. The method can include joining first ends of a plurality of tether structures to respective ones of a plurality of dice regions on a first wafer, the plurality of dice regions on the first wafer corresponding to a first combination of materials. The method can also include attaching a second wafer to second ends of the plurality of tether structures. The method can also include processing the first wafer to disconnect each of the dice regions on the first wafer from other dice regions on the first wafer. The method can also include separating from the second wafer, each of the dice regions and the plurality of tether structures on the first wafer. The method can also include attaching to a third wafer, each of the dice regions and the plurality of tether structures on the first wafer. The method can also include selecting a cross sectional area of the tether structures on the first water in contact with the plurality of dice regions based on a size of the one of the plurality of dice regions. Processing the first wafer can include at least one of mechanical grinding, mechanical dicing, and chemical etching. The method can also include joining first ends of a plurality of tether structures to respective ones of a plurality of dice regions on a fourth wafer, the plurality of dice regions on the fourth wafer corresponding to a second combination of materials different from the first combination of materials. The method can also include attaching a fifth wafer to second ends of the plurality of tether structures. The method can also include processing the fourth wafer to disconnect each of the dice regions on the fourth wafer from other dice regions on the fourth wafer. The method can also include separating from the fifth wafer, each of the dice regions and the plurality of tether structures on the fourth water. The method can also include attaching to the third wafer, each of the dice and the plurality of tether structures on the fourth wafer. The first combination of materials includes silicon and silicon dioxide and the second combination of materials includes gallium nitride. The method can also include patterning an electrical connection onto the third wafer prior to the attachment of the dice to the third wafer. The method can also include depositing solder bumps onto the electrical connections, the solder bumps being configured to accommodate at least one electrical connection to each of the dice attached to the third wafer. The method can also include forming vias configured to connect a patterned electrical connection on the third wafer to at least one of the dice.

In an aspect, the disclosure can feature a transfer printing method. The method can include forming a plurality of dice on a base wafer, producing tether structures for the dice on the base water, and securing the tether structures to a carrier wafer 32. The method can also include processing the dice while the tether structures are secured to the carrier wafer 32. The method can also include processing the dice by grinding the base wafer while the tether structures are secured to the carrier, and then dicing the base wafer. The tethers can include variable securing strengths to the carrier wafer 32. Those securing strengths can be tunable depending on the anticipated processing. The method can also include layer transferring a plurality of the dice to an interconnect water 34 to electrically connect at least one of the dice with one or more other dice (e.g., some of the dice being transferred, or other dice already secured to the interconnect wafer 34). In that case, the top of the dice preferably physically connects to the interconnect wafer 34. In addition, the method may also include securing a package base to the bottom sides of the dice on the interconnect wafer 34.

BRIEF DESCRIPTION OF THE DRAWINGS

The present disclosure will now be described, by way of example, with reference to the accompanying drawings, in which:

FIGS. 2-7 illustrate an example of a process of forming a multi-chip device using layer transfer processes.

FIG. 3 illustrates r example of dicing a wafer having a plurality of individual dice.

FIG. 4 illustrates an example of preparing an interconnect wafer.

FIG. 6 illustrates an example of adding a backing layer.

FIG. 7 illustrates an example of final dicing and packaging.

DETAILED DESCRIPTION

The inventors have recognized that certain transfer printing methods involving silicon may not be suitable for processes involving gallium nitride (GaN) or other compound semiconductor materials because of differences in physical and chemical properties, and also because there may not be an analogous oxide layer in GaN that can be etched away as can be done with the silicon. The inventors have recognized that a transfer printing method can be employed that uses tethers (e.g. polymer tethers) that can be adjusted in size to determine a strength of the tether to provide a transfer printing method that is universal and can be used with any combination of semiconductor materials.

Illustrative examples can more efficiently integrate individual dice formed on one or more wafers into a single, monolithic integrated circuit. To that end, a die moving member may transfer a plurality of dice from an original wafer to a pre-specified location on a receiving wafer. Before being transferred, the dice preferably can be loosely held to the original wafer using variable strength tethers. In addition to being tunable to different holding strengths, the tethers also can be used across a plurality of different die technologies, such as silicon, gallium arsenide, and gallium nitride technologies.

To permit inter-die communication, the single monolithic integrated circuit may have an interconnect wafer or similar apparatus to electrically connect the various received dice. Illustrative examples can be configured to be thermally efficient, however, regardless of the thermal capacity of the interconnect wafer. As such, the interconnect wafer may be formed from a wider variety of materials, such as glass or some other relatively thermally inefficient material.

Figure 1:
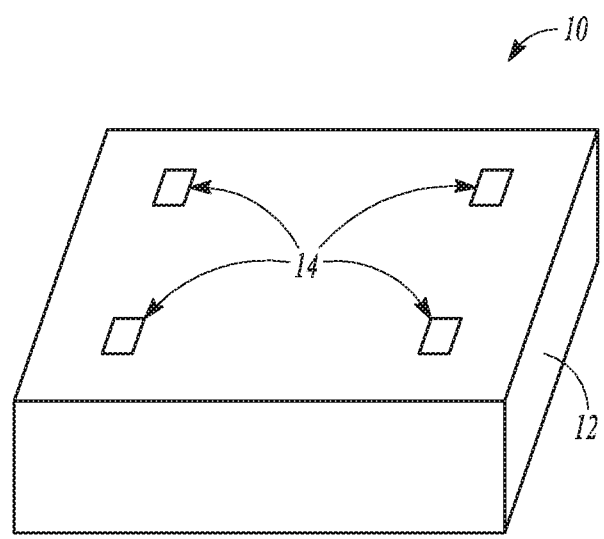
FIG. 1 illustrates an example of a fabricated integrated circuit.

FIG. 1 illustrates an example of a monolithic integrated circuit/microchip (hereinafter "integrated circuit 10"). More specifically, the integrated circuit 10 preferably can be formed by at least two separate dice that each can be formed on the same or separate wafers. In an example, one of the dice may be formed in a first process and have a first type of circuitry (e.g., silicon circuitry), while the second of the dice may be formed in a separate, second process and have different circuitry (e.g., gallium nitride circuitry). In other words, fabrication of the first die can be decoupled from fabrication of the second die.

This decoupling can enable a wide variety of potential dice combinations, such as III-V semiconductor device/CMOS device combinations, which generally present difficulties if attempting to form them with the same or coupled processes. Specifically, growth of III-V semiconductor devices can be more difficult on silicon because of the lattice mismatch between silicon and III-V materials. Also, the process used to fabricate III-V devices, such as gold metallization, often are not compatible with CMOS devices. As shown below, illustrative examples preferably take a monolithic approach to combine two disparate dice, such as dice with III-V devices and dice with CMOS devices. Among other benefits, the ultimate integrated circuit 10 preferably includes:

1) reduced parasitics,
2) a smaller footprint,
3) capability of parallel/rapid processing, and/or
4) the capability of being formed using layer transfer processing with small dice.

Among other things, the first die can include conventional circuitry, while e second die can include high-performance circuitry. For example, the first die can include conventional silicon CMOS circuitry, while the second die can include semiconductor circuitry. Among other things, that MN circuitry can include at least one of the following types of circuitry:

gallium arsenide ("GaAs") devices,
high electron mobility transistors ("HEMT"),
metal semiconductor field effect transistors ("MESFET"),
heterojunction bipolar transistors ("HBT," see below),
indium phosphide HBT or HEMT ("InP-HEMT"), and
gallium nitride HEMT.

Accordingly, the integrated circuit 10 of FIG. 1 can implement a wide variety of applications. For example, the integrated circuit 10 can be used in silicon display backplanes, gallium arsenide solar cells, gallium arsenide MESFET arrays, and gallium arsenide infrared imagers. Of course, the different types of circuitry and dice described above and their applications are merely examples and not intended to limit various examples described herein.

Specifically, only one or neither of the dice may be implemented as CMOS circuitry or a III-V semiconductor device. For example, one or both may be implemented as microelectromechanical systems devices (i.e., "MEMS devices"), or the same device. In another example, if implemented as a III-V semiconductor device, the second die may be formed with circuitry that is not in the above noted list of devices. Moreover, the integrated circuit 10 may have more than two dice formed with the same or disparate processes. For example, the integrated circuit 10 can include 3 dice, 4 dice, or 5 or more dice, and those dice can include different circuitry, or have some overlap in makeup and functionality (e.g., 2 dice can include the same type of device and the rest can be a different type of device(s)). Some examples may form the integrated circuit 10 from dice having the same circuitry.

As with many other such devices, the integrated circuit 10 of FIG. 1 can include an exterior package 12 that can protect the two or more noted dice (not shown in FIG. 1). One or more surfaces of the package 12 can also include a plurality of electrical interfaces 14 for interconnecting with the dice within the package 12. For example, the electrical interfaces 14 can include conventional metal pads that may be soldered with a bonding wire or other electrical interconnect (e.g., a flip-chip connection) to permit electrical communication between the dice and other electronic devices. The integrated circuit 10 can be mounted on a printed circuit board (not shown) within a larger system (e.g., a computer system, smart phone, etc.). Accordingly, using the interfaces 14 on an outside surface, the integrated circuit 10 can communicate with other circuitry both on and off an internal circuit board.

FIGS. 2-7 illustrate an example of a process of forming the monolithic integrated circuit 10 using layer transfer processes. This monolithic integrated circuit 10 also may be considered to be a multi-die device. Specifically, this process includes steps that span FIGS. 2-7.

It should be noted that the process described in FIGS. 2-7 is substantially simplified from a longer process that normally would be used to form the integrated circuit 10. Accordingly, the process of forming the integrated circuit 10 can include many other steps, such as testing steps, additional etching steps, or additional packaging steps, which are known to those having ordinary skill in the art. In addition, some of the steps can be performed in a different order than that shown, or at the same time. Those skilled in the art therefore can modify the process as appropriate. Moreover, as noted above and below, many of the materials and structures noted are but examples of a wide variety of different materials and structures that may be used. Those skilled in the art can select the appropriate materials and structures depending upon the application and other constraints. Accordingly, discussion of specific materials and structures is not intended to limit the disclosure.

The process illustrated in FIGS. 2-7 preferably uses bulk/plural fabrication techniques, which form a plurality of integrated circuits 10 on the same receiving wafer at the same time. Although much less efficient, those skilled in the art can apply these principles to a process that forms only one integrated circuit 10. In illustrative embodiments, the process of FIGS. 2-7 may use processes described in co-pending U.S. patent application Ser. No. 14/923,828, entitled "Transfer Printing Method," and naming James Fiorenza as the inventor, the disclosure of which is incorporated herein, in its entirety, by reference.

Figure 2A:
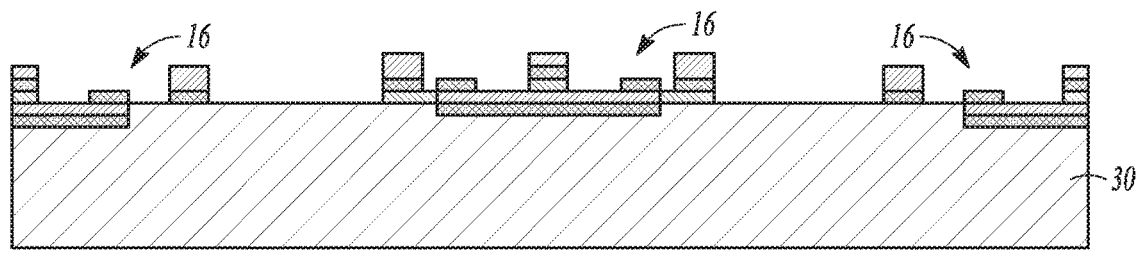
FIGS. 2A-2C illustrate an example of wafer fabrication, tether formation, and carrier wafer.
Figure 2B:
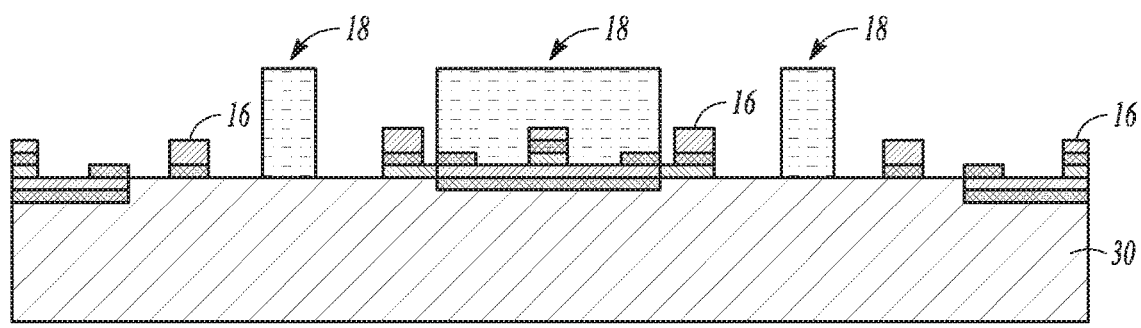
Figure 2C:
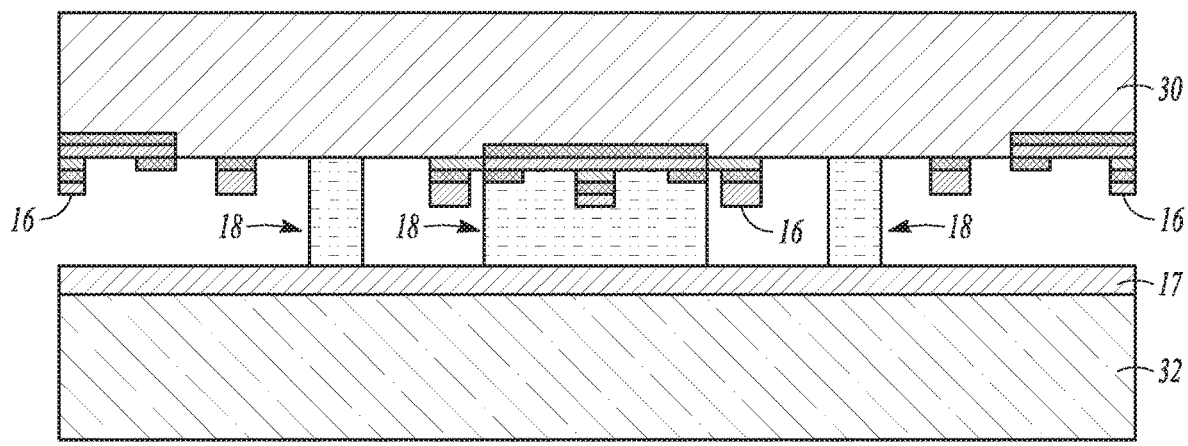

FIGS. 2A-2C begin the process by preparing an original wafer 30 for transfer to another wafer. In illustrative embodiments, for improved efficiency, the process prepares a plurality of original wafers 30 at the same time using steps illustrated in FIGS. 2A-2C and FIG. 3, among others (among others). For simplicity, however, the discussion of FIGS. 2A-2C and FIG. 3 address preparation of a single wafer.

The process thus begins at step FIG. 2A, in which conventional semiconductor fabrication processes form a plurality of individual dice 16 on an original wafer 30. To that end, as is conventional in the art, fabrication processes may form a two-dimensional array of dice 16 across the top surface of a single wafer. FIG. 2A shows a cross-sectional view of a small portion of one such original wafer 30. In this example, FIG. 2A shows a cross-sectional view of one full die 16 (in the middle) and portions of two separate dice 16 on each side of the full die 16. Of course, the dice 16 ultimately will be formed into individual, standalone elements at a later dicing step (discussed below).

FIG. 2B illustrates formation of a plurality of posts/tethers 18 on the top surface of the original wafer 30. These tethers 18 can be used at a later step to transfer the dice 16 (also known as chips or chiplets) from a carrier wafer 32 to another substrate, such as an interconnect wafer 34. In an example, the tethers 18 can be formed from a photoactive material or a photoresist material, such as polyamide. To that end, step 2 deposits the polyamide or other photoactive polymer onto the top surface of the original wafer 30. Next, using a mask, the process can pattern and cure the polyamide layer to form the plurality of tethers 18, such as those illustrated in in FIG. 2B.

As shown, the tethers 18 of FIG. 2B can take on a variety of shapes and sizes. Specifically, the tethers 18 can be configured/tuned to have a prescribed holding strength to secure with another substrate, such as a carrier wafer 32 as illustrated in FIG. 2C. For example, wider tethers 18 can be used when relatively high force events or steps are to be performed, such as grinding. Conversely, some or all of the tethers 18 can be formed to have a relatively low holding strength, such as to be easily removed from a carrier wafer 32 at a subsequent step. Those skilled in the art can select the appropriate holding strength for each of the tethers 18.

To those ends, the process continues as illustrated in FIG. 2C, in which the original wafer 30 can be rotated 180 degrees and mounted to an adhesive layer 17 on the top surface of a carrier wafer 32. As shown, the tethers 18 can extend beyond the vertical extent of the circuitry on the original wafer 30 (i.e., above its top surface). As such, the tethers 18 can space the original wafer 30, with its dice 16, from the top surface of the carrier wafer 32. An adhesive layer 17 or other material on the carrier wafer 32 can couple with the tethers 18 to secure the original wafer 30 to the carrier wafer 32.

At this point, the original wafer 30 may be further processed depending on the ultimate application. For example, conventional processes may be used to grind the backside of the original water 30 to produce thinner dice 16. As known by those skilled in the art, grinding can apply a relatively high force to the backside of the original wafer 30. As such, the tethers 18 preferably can be configured to be able to withstand this anticipated force without too much damage. Accordingly, some or all of the tethers 18 can be formed thicker and more robustly to firmly hold the original wafer 30 to the carrier wafer 32. In an example, a length of the tethers parallel to the original wafer 30 can be at least 100 nm.

Figure 3:
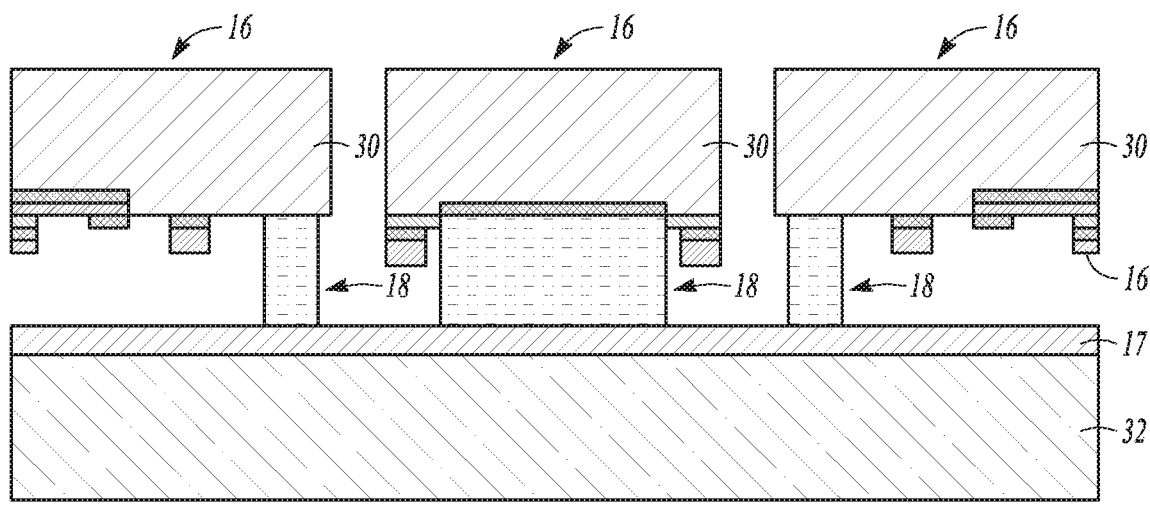

The process continues as illustrated in FIG. 3, in which the original wafer 30 is further processed. Specifically, FIG. 3 illustrates dicing through the backside of the wafer to form individual dice 16. Those skilled in the art can use any of a number of different dicing/separating techniques, such as plasma etching, laser cutting, or die sawing.

Figure 4:
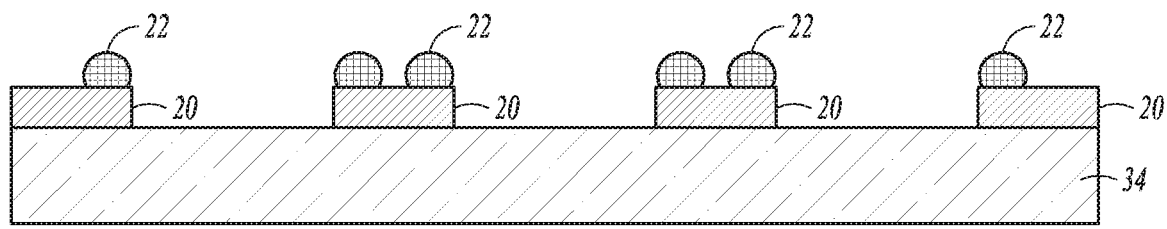

Before, at the same time as, or after the steps illustrated in FIGS. 2A-2C and FIG. 3, the process also includes preparing a separate interconnect wafer 34 to receive dice 16 from one original wafer 30, or a plurality of different original wafers 30 as illustrated in FIG. 4. To that end, the interconnect wafer 34 can undergo metallization and patterning processes to form a metalized pattern of electrical lines 20 on the top surface of the interconnect wafer 34. Electrical interconnect material, such as solder bumps 22, can be placed on prescribed pads of the metalized pattern 20 of the interconnect wafer 34.

Figure 5A:
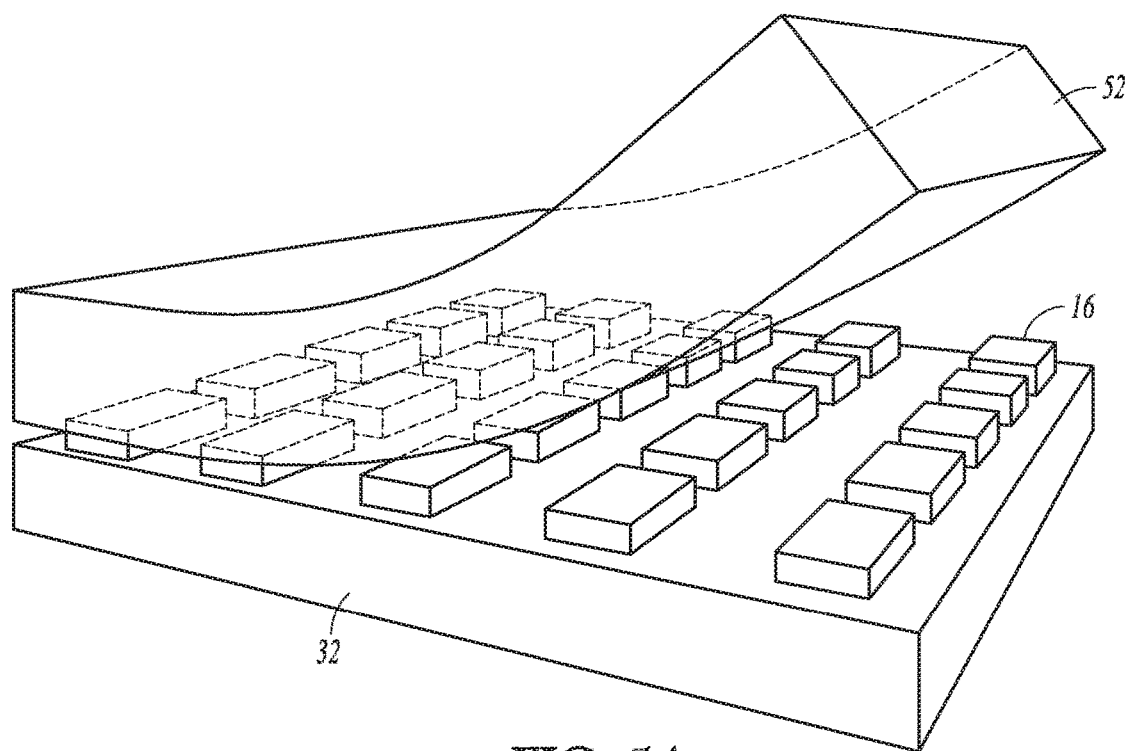
FIGS. 5A-5E illustrate an example of parallel transfer of dice (aka "chiplets") to an interconnect wafer.
Figure 5B:
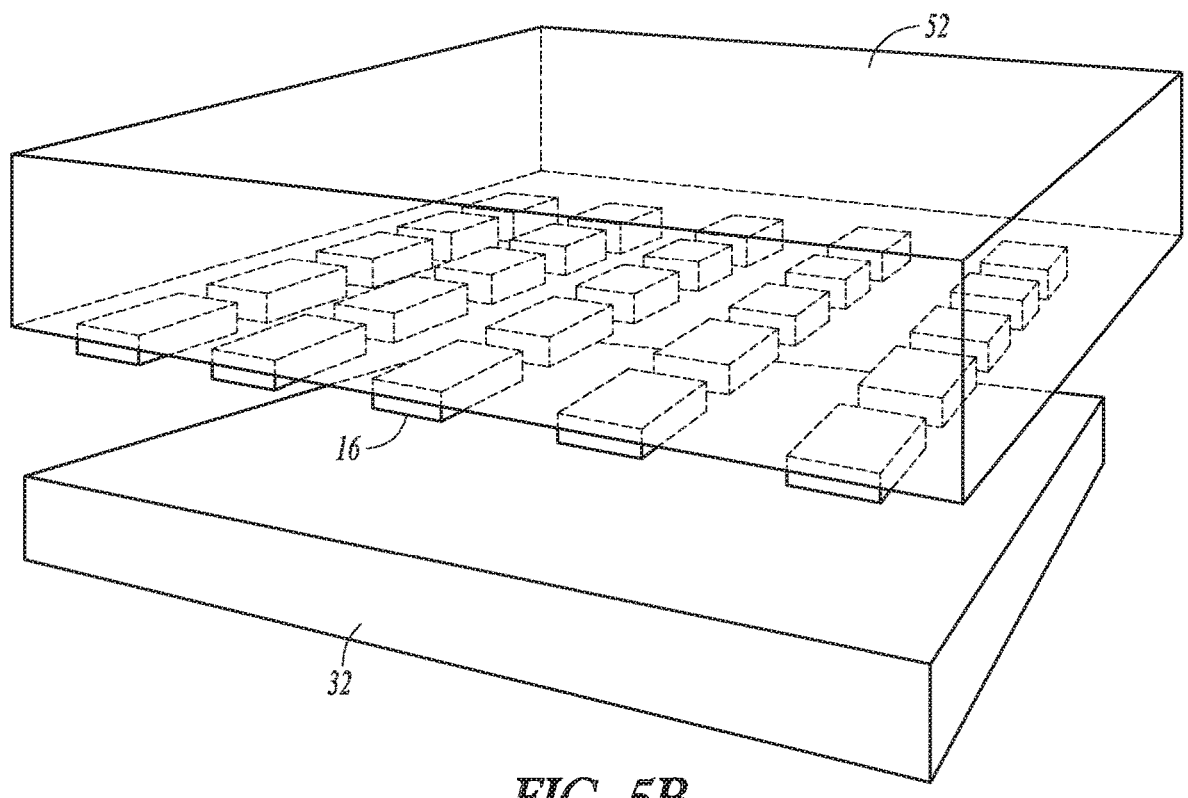
Figure 5C:
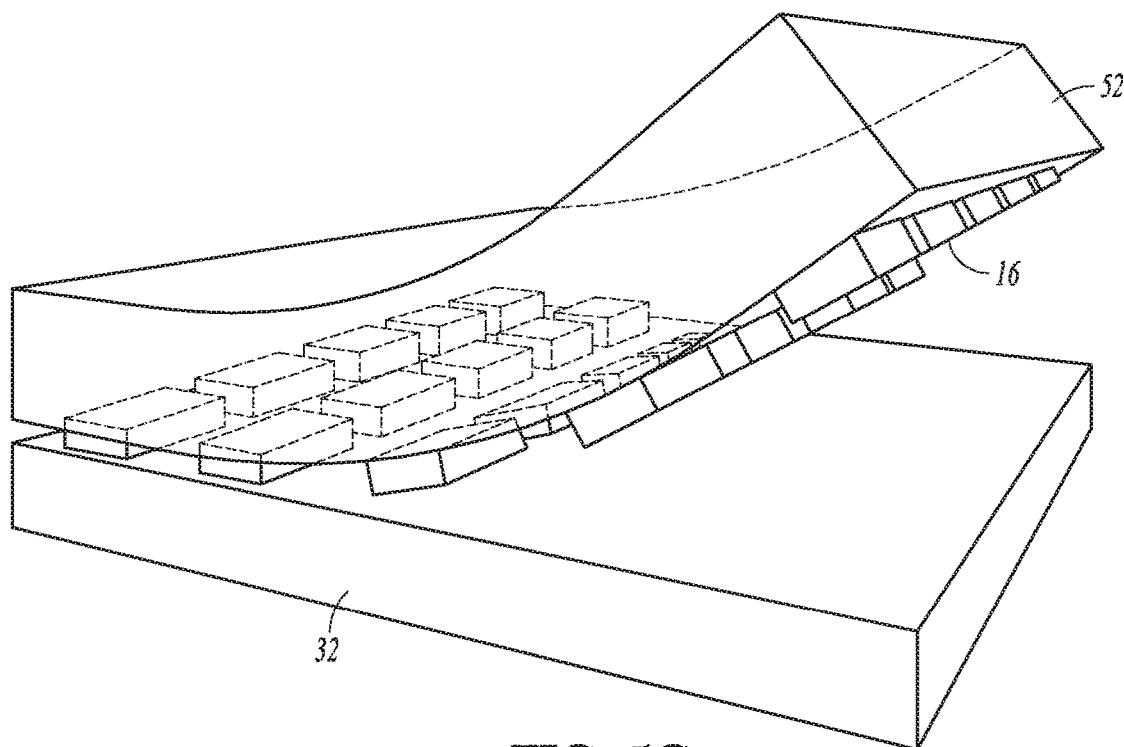
Figure 5D:
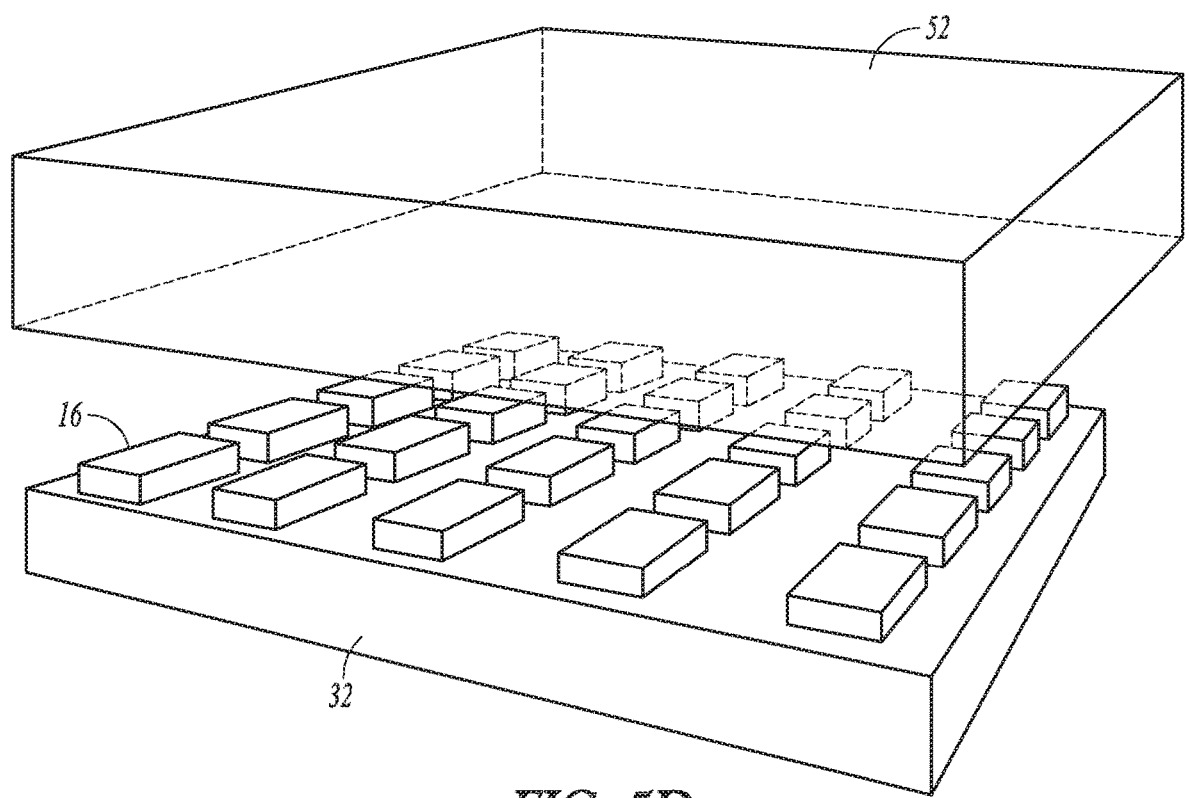

At this point in the process, the interconnect wafer 34 can be ready to receive a plurality of dice 16 at prescribed locations. At the same time, the carrier wafer 32 can be ready to transfer prescribed dice 16 to the interconnect wafer 34. Accordingly, the process continues as illustrated in FIGS. 5A-5E, in which conventional processes transfer one or more dice 16 from the carrier wafer 32 to prescribed locations on the interconnect wafer 34. Preferably, this involves a parallel transfer of dice 16 onto the interconnect wafer 34 using some conventional process, such as a layer transfer processes. The layer transfer process can include using a die moving member 52. The die moving member 52 can include one or more dies grasping portions that can be brought into contact with one or more of the plurality of dice 16 on the carrier wafer 32 as illustrated in FIG. 5A. The die moving member 52 and grasping portions can be formed from a flexible material having a relatively low Young's modulus (e.g. a Young's modulus of less than approximately 1 MPa). In an example, the die moving member 52 and grasping portions can be formed from a polymer, polydimethyl-siloxane (PDMS), or polyamide. In an example, the die moving member 52 can include a 4×5 array of die grasping portions for coupling to a 4×5 array of dice 16. In an example, the die moving member 52 can include a smaller number of die grasping portions than available dice 16. The die moving member 52 can then be used to separate one or more of the plurality of dice 16 from the carrier wafer 32 as illustrated in FIG. 5B. The die moving member 52 can then be used to transfer the separated one or more of the plurality of dice 16 to an interconnect wafer 34 as illustrated in FIG. 5C. The die moving member 52 can then be separated from the separated one or more of the plurality of dice 16, such as to leave the one or more of the plurality of dice 16 on the interconnect wafer 34 as illustrated in FIG. 5D.

The die moving member 52 can remove the dice 16 from the original wafer 30, breaking the tethers 18. Accordingly, the die moving member 52 can be controllably moved, such as to substantially simultaneously couple with a plurality of the dice 16 on the original wafer 30 (or a single die 16), and then can be moved upwardly to disconnect the dice 16 and their tethers 18 from the original wafer 30. If the rate at which the die moving member 52 moves upwardly is too slow, however, then some of the dice 16 may not untether from the original wafer 30. Accordingly, those skilled in the art should select a speed that is sufficient to cleanly and effectively remove the dice 16 from their tethers 18. In an example, each one of the dice 16 can be positioned on the original wafer 30 at a location that corresponds with a specific receiving surface on the interconnect wafer 34.

The die moving member 52 can be formed from material that, upon contact, naturally couples with the dice 16. The die moving member 52 may be formed to have a die grasping portion (not shown) from a flexible material having a relatively low Young's modulus. For example, at least the die grasping portion can include a Young's modulus of less than about 1 MPa. Other embodiments, however, may have a higher Young's modulus. For example, part or all of the die moving member 52 may be implemented as a polymeric stamp formed from poly-dimethyl-siloxane ("PDMS"). Indeed, those skilled in the art can use other materials to accomplish same function.

Figure 5E:
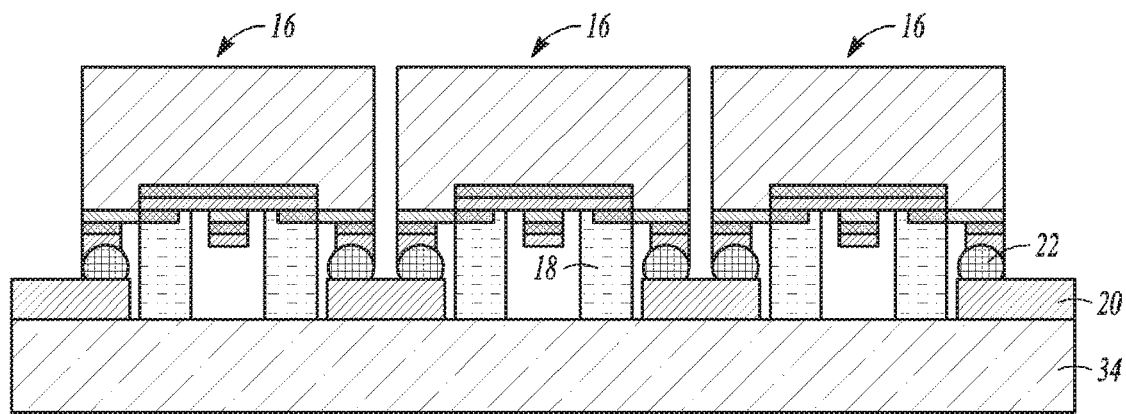

As shown in FIG. 5E, the individual dice 16 can be positioned onto the solder bumps 22 of the interconnect wafer 34. Accordingly, those solder bumps 22 can contact interface pads on each of the dice 16. At this point, however, the recently transferred dice 16 may not be mechanically/physically coupled to the interconnect wafer 34. Subsequent reflow processes can be used electrically and mechanically connect the dice 16 to the interconnect wafer 34.

Also at this point in the process, the interconnect wafer 34 may have no dice 16 when receiving this set of dice 16, or already have other dice 16 received from other wafers during earlier processing. For example, the dice 16 of FIG. 2 may include silicon circuitry, while the interconnect wafer 34 already may have dice 16 with gallium arsenide circuitry.

Although FIG. 5E shows the tethers 18 still coupled with the dice 16, various embodiments may not have the tethers 18 at this point in the process. For example, before transferring the dice 16, conventional processes may have controllably degraded some or all of the tethers 18, such as to reduce their holding strength. For example, an aching process to "burn away" some of the material of the tethers 18 can be used. As known by those skilled in the art, an ashing process can use an asher to attack the polyamide from the sides while not harming the dice 16.

Figure 6:
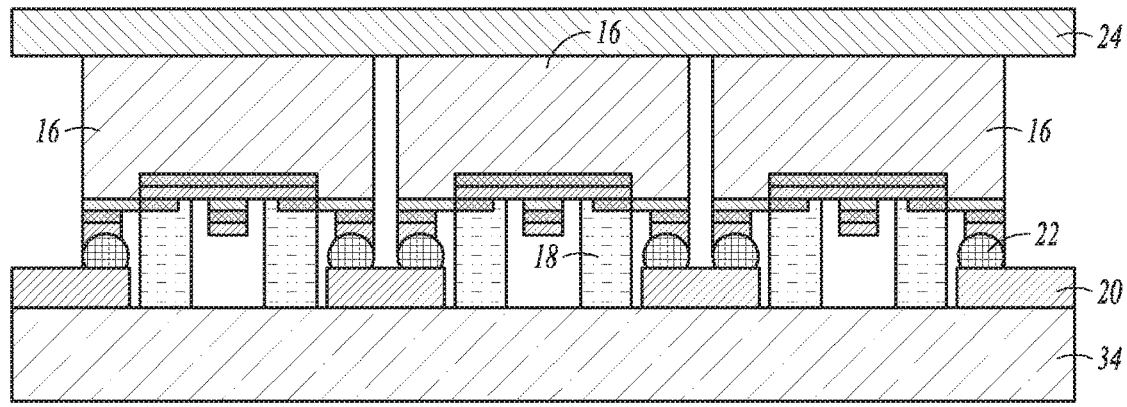

After the dice 16 are coupled with the interconnect wafer 34, the process continues as illustrated in FIG. 6, in which a conductive backing 24 can be added to the back sides of the dice 16. This backing can enhance structural support and can facilitate packaging material mounting. Among other things, the conductive backing 24 can include a thin copper layer, such as a copper foil.

Figure 7:
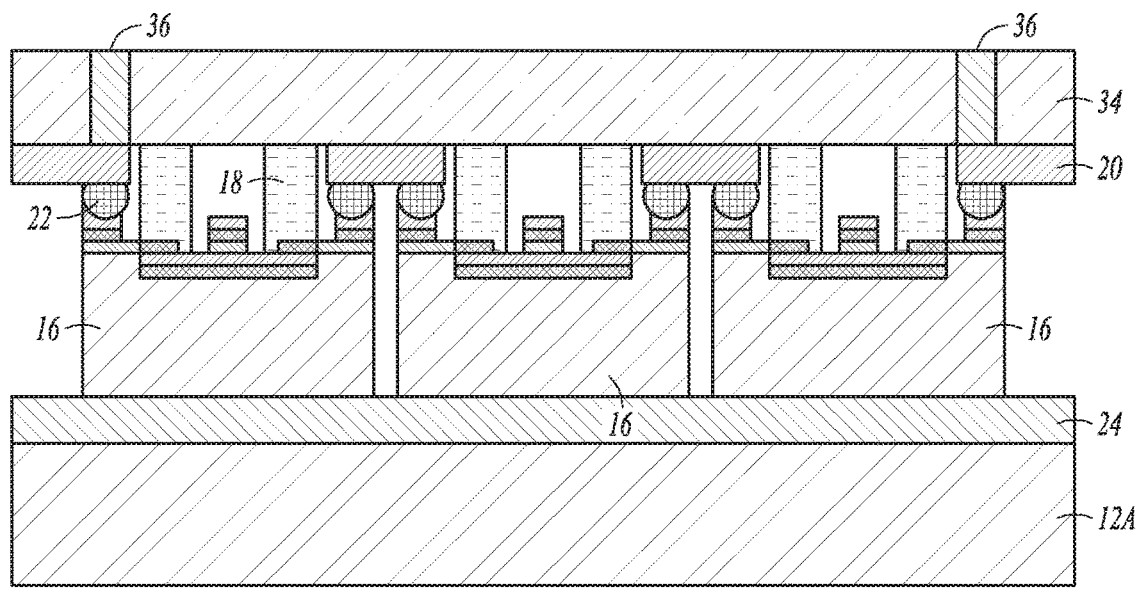

The process concludes as illustrated in FIG. 7, in which interconnect wafer 34 can be packaged and diced. To that end, a package base 12A can be positioned relative to the conductive backing 24, and then the entire apparatus can be diced, such as to form individual monolithic integrated circuits 10 that each can include a plurality of individual dice 16 as discussed above. Among other things, the package base 12A can include a conventional plastic or molded substrate. Subsequent processes optionally may encapsulate the entire interconnect wafer 34 before dicing. Indeed, other types of package bases 12A can be used and thus, the specific type of packaging is illustrative.

Applying the package base 12A to the conductive backing 24 rather than to the interconnect wafer 34 is expected to improve thermal performance. Specifically, heat can pass through each die 16 from its top surface to the conductive layer and into the package base 12A. Among other things, this can be the case for silicon dice and gallium nitride grown on silicon or silicon carbide dice, for example, since their thermal conductivities can be relatively high.

Alternative embodiments can add thermally conductive vias 36 extending from the top surface of the dice 16 to further direct heat away from the interconnect wafer 34 and toward the package base 12A. The vias 36, which may be filled or hollow, may be coated with copper to improve thermal conductivity.

Accordingly, due to this thermal efficiency, the interconnect wafer 34 may be formed from a material that is not necessarily thermally efficient, such as glass. This permits a wider variety of possible materials that can be selected for the interconnect wafer 34, improving overall performance of the integrated circuit 10.

Figure 8:
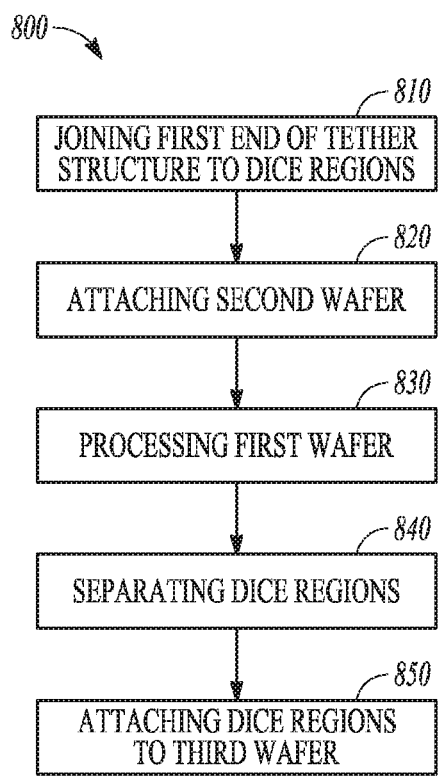
FIG. 8 illustrates an example of a method of transfer printing.

FIG. 8 illustrates a method of transfer printing, such as can accommodate both silicon and compound semiconductor structures. A first end of a tether structure can be joined to one of a plurality of dice regions on a first wafer (step 810). A second wafer can be attached to a second end of the tether structure (step 820). The first wafer can be processed, such as to disconnect the one of the plurality of dice regions on the first wafer from other dice regions on the first wafer (step 830). The one of the plurality of dice regions and the tether structure can be separated from the second wafer (step 840). The one of the plurality of dice regions can be attached to a third wafer using the second end of the tether structure (step 850). A cross sectional area of the tether structure in contact with the one of the plurality of dice regions can be selected based on a size (e.g., volume, area, or length) of the one of the plurality of dice regions. The method of transfer printing described in FIG. 8 is only on example, and other methods can be used. For example, diced regions from a first wafer and a second wafer can be transferred to a temporary carrier wafer with a device side down. The diced regions can be flipped by transferring to another carrier wafer and de-bonding the first carrier water. A dielectric can be applied on top of the diced regions. Vias can be etched and metal can be applied to provide an interconnect between devices on the diced regions. In an example, diced regions from a first wafer and a second wafer can be transferred to a temporary carrier wafer with a device side up. A dielectric can be applied on top of the diced regions. Vias can be etched and metal can be applied to provide an interconnect between devices on the diced regions.

Although the above discussion discloses various exemplary embodiments of the invention, it should be apparent that those skilled in the art can make various modifications that will achieve some of the advantages of the invention without departing from the true scope of the invention.

The invention claimed is:

1. A method of transfer printing, the method comprising:
obtaining a first wafer having a tether structure and a plurality of dice regions, the tether structure having a first end and a second end, the first end attached to a first dice region of the plurality of dice regions, wherein the tether structure extends perpendicular to a surface of the first wafer, wherein the first end is vertically aligned with the second end, and wherein the tether structure extends beyond a vertical extent of circuitry on the first wafer;
attaching, subsequent to obtaining the first wafer having the tether structure and plurality of dice regions, a second wafer to the second end of the tether structure;
without removal of a sacrificial layer, processing the first wafer to disconnect the first dice region of the plurality of dice regions on the first wafer from other dice regions on the first wafer;
separating the first dice region of the plurality of dice regions on the first wafer and the tether structure from the second wafer; and
attaching the separated first dice region of the plurality of dice regions to a third wafer using the second end of the tether structure.

2. The method of claim 1, comprising selecting a cross sectional area of the tether structure in contact with the first dice region of the plurality of dice regions based on a size of the first dice region of the plurality of dice regions.

3. The method of claim 1, comprising selecting a cross sectional area of the tether structure in contact with the first dice region of the plurality of dice regions based on an area of the first dice region of the plurality of dice regions.

4. The method of claim 1, comprising selecting a cross sectional area of the tether structure in contact with the first dice region of the plurality of dice regions based on a volume of the first dice region of the plurality of dice regions.

5. The method of claim 1, comprising using an elastomeric mask to separate the first dice region of the plurality of dice regions on the first wafer and the tether structure from the second wafer.

6. The method of claim 1, wherein processing the first wafer to disconnect the first dice region of the plurality of dice regions includes at least one of mechanical grinding, mechanical dicing, or chemical etching.

7. The method of claim 1, comprising:
joining a first end of a second tether structure to a second dice region of a plurality of dice regions on a fourth wafer;
attaching a fifth wafer to a second end of the second tether structure;
processing the fourth wafer to disconnect the second dice region of the plurality of dice regions on the fourth wafer from other dice regions on the fourth wafer;
separating the second dice region of the plurality of dice regions on the fourth wafer and the second tether structure from the fifth wafer; and
attaching the separated the second dice region of the plurality of dice regions to the third wafer using the second end of the second tether structure, wherein the first dice region of the plurality of dice regions on the first wafer includes silicon and the second dice region of the plurality of dice regions on the fourth wafer includes gallium nitride.

8. The method of claim 7, comprising patterning an electrical connection onto the third wafer prior to the attachment of the first dice region or the second dice region to the third wafer.

9. The method of claim 8, comprising forming solder bumps onto the electrical connections, the solder bumps being configured to accommodate at least one electrical connection to each of the first dice region or the second dice region attached to the third wafer.

10. The method of claim 9, comprising forming vias configured to connect a patterned electrical connection on the third wafer to at least one of the first dice region or the second.

11. The method of claim 10, comprising forming a conductive layer adjacent to the first dice region or the second dice region on a side of the first dice region or the second dice region opposite to the third wafer.

12. The method of claim 11, comprising dicing the third wafer and surrounding the first dice region or the second dice region on the third wafer with a packaging material, wherein at least one electrical connection connects the first dice region or the second dice region on the third wafer to an exterior of the packaging material.

13. A method of parallel transfer printing that can accommodate a first semiconductor structure and a second semiconductor structure, the method comprising:
joining first ends of a plurality of tether structures to respective ones of a plurality of dice regions on a first wafer, the plurality of dice regions on the first wafer corresponding to a first combination of materials;
attaching a second wafer to second ends of the plurality of tether structures, wherein the tether structures extend perpendicular to a surface of the first wafer, wherein the first ends are vertically aligned with corresponding second ends, and wherein the tether structures extend beyond a vertical extent of circuitry on the first wafer;
without removal of a sacrificial layer, processing the first wafer to disconnect each of the dice regions on the first wafer from other dice regions on the first wafer;
separating from the second wafer, each of the dice regions and the plurality of tether structures on the first wafer; and
attaching to a third wafer, each of the dice regions and the second ends of the plurality of tether structures on the first wafer.

14. The method of claim 13, comprising selecting a cross sectional area of the tether structures on the first wafer in contact with the plurality of dice regions based on a size of the one of the plurality of dice regions.

15. The method of claim 13, wherein processing the first wafer includes at least one of mechanical grinding, mechanical dicing, and chemical etching.

16. The method of claim 13, comprising:
joining first ends of a plurality of tether structures to respective ones of a plurality of dice regions on a fourth wafer, the plurality of dice regions on the fourth wafer corresponding to a second combination of materials different from the first combination of materials;
attaching a fifth wafer to second ends of the plurality of tether structures;
processing the fourth wafer to disconnect each of the dice regions on the fourth wafer from other dice regions on the fourth wafer;
separating from the fifth wafer, each of the dice regions and the plurality of tether structures on the fourth wafer; and
attaching to the third wafer, each of the dice and the plurality of tether structures on the fourth wafer.

17. The method of claim 16, wherein the first combination of materials includes silicon and silicon dioxide and the second combination of materials includes gallium nitride.

18. The method of claim 17, comprising patterning an electrical connection onto the third wafer prior to the attachment of the dice to the third wafer.

19. The method of claim 18, comprising depositing solder bumps onto the electrical connections, the solder bumps being configured to accommodate at least one electrical connection to each of the dice attached to the third wafer.

20. The method of claim 19, comprising forming vias configured to connect a patterned electrical connection on the third wafer to at least one of the dice.

21. A method of transfer printing that can accommodate a first semiconductor structure and a second semiconductor structure, the method comprising:
joining a first end of a tether structure to one of a plurality of dice regions on a first wafer;
attaching a second wafer to a second end of the tether structure, wherein the tether structure extends perpendicular to a surface of the first wafer, wherein the first end is vertically aligned with the second end, and wherein the tether structure extends beyond a vertical extent of circuitry on the first wafer;
without removal of a sacrificial layer, processing the first wafer to disconnect the one of the plurality of dice regions on the first wafer from other dice regions on the first wafer;
separating the one of the plurality of dice regions on the first wafer and the tether structure from the second wafer; and
attaching the separated one of the plurality of dice regions to a third wafer using the second end of the tether structure.

22. The method of claim 21, comprising patterning an electrical connection onto the third wafer prior to the attachment of the separated one of the plurality of dice regions to the third wafer.

23. The method of claim 22 comprising forming solder bumps onto the electrical connections, the solder bumps being configured to accommodate at least one electrical connection to the separated one of the plurality of dice regions attached to the third wafer.

* * * * *